(12) United States Patent
Wadland et al.

(10) Patent No.: US 7,594,215 B2
(45) Date of Patent: Sep. 22, 2009

(54) METHOD AND SYSTEM FOR OPTIMIZED AUTOMATED IC PACKAGE PIN ROUTING

(75) Inventors: Ken Wadland, Grafton, MA (US); Joe Morrison, Apalachin, NY (US); Julie Blumenthal, Waltham, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 237 days.

(21) Appl. No.: 11/112,868

(22) Filed: Apr. 21, 2005

(65) Prior Publication Data
US 2006/0112366 A1 May 25, 2006

Related U.S. Application Data

(60) Provisional application No. 60/629,804, filed on Nov. 20, 2004.

(51) Int. Cl.
*G06F 17/50* (2006.01)
*H03K 17/693* (2006.01)

(52) U.S. Cl. .............................. 716/15; 716/12; 716/13; 716/14

(58) Field of Classification Search ...................... 716/2, 716/5, 12–15
See application file for complete search history.

(56) References Cited

U.S. PATENT DOCUMENTS

| | | | |
|---|---|---|---|
| 5,856,927 A | 1/1999 | Greidinger et al. | |
| 6,057,169 A | 5/2000 | Singh et al. | |
| 6,111,859 A | 8/2000 | Godfrey et al. | |
| 6,225,143 B1 | 5/2001 | Rao et al. | |
| 6,226,560 B1 | 5/2001 | Hama et al. | |
| 6,230,299 B1 | 5/2001 | McSherry et al. | |
| 6,247,161 B1 | 6/2001 | Lambrecht et al. | |
| 6,266,797 B1 | 7/2001 | Godfrey et al. | |
| 6,275,975 B1 | 8/2001 | Lambrecht et al. | |
| 6,415,422 B1 | 7/2002 | Mehrotra et al. | |
| 6,510,539 B1 | 1/2003 | Deemie et al. | |
| 6,516,447 B2 | 2/2003 | Wadland et al. | |
| 6,574,780 B2 | 6/2003 | Le Coz | |
| 7,017,137 B2 | 3/2006 | Wadland et al. | |
| 2002/0028573 A1* | 3/2002 | Kitamura et al. | ............ 438/612 |
| 2002/0035720 A1* | 3/2002 | Kitamura et al. | .............. 716/11 |
| 2003/0126578 A1* | 7/2003 | Wadland et al. | ................ 716/12 |
| 2003/0214030 A1* | 11/2003 | Bodas | ........................ 257/734 |

OTHER PUBLICATIONS

Chen, S.-S. et al. "An Even Wiring Approach to the Ball Grid Array Package Routing" 1999 IEEE International Conference on Computer Design (ICD '99), pp. 303-306.

(Continued)

*Primary Examiner*—Jack Chiang
*Assistant Examiner*—Suresh Memula
(74) *Attorney, Agent, or Firm*—Vista IP Law Group, LLP (57) ABSTRACT

An automated method and system is disclosed to determine an Integrated Circuit (IC) package interconnect routing using a mathematical topological solution. A global topological routing solution is determined to provide an IC package routing solution. The global topological solution is used in conjunction with necessary design parameters to determine the optimal geometric routing solution which can include reassignment of IC nets and/or pin assignments and/or relocation of IC nets.

46 Claims, 8 Drawing Sheets

OTHER PUBLICATIONS

Dai, W. et al. "Routability of a Rubber-Band Sketch" Proceedings of the 28th ACM/IEEE Design Automation Conference (DAC '91), 1991, pp. 45-48.

Hama, T. et al. "Curvilinear Detailed Routingn with Simultaneous Wire-Spreading and Wire-Fattening" IEEE Transactions on Computer-Aided Design of Integrated Circuits and Systems, Nov. 1999, vol. 18, No. 11, pp. 1646-1653.

Leiserson, C. et al. "Algorithms for Routing and Testing Routability of Planar VLSI Layouts" Proceedings of the 17th ACM Symposium on Theory of Computing, Providence, RI, 1985, pp. 69-78.

Wadland, K. "Topological Routing, A Case Study: Spider Route" Proceedings of the Cadence Technical Conference, La Jolla, CA, Apr. 2001, pp. 41-46.

Wadland, K. "Spider Route—A Topological Package Router" Proceedings of the International Cadence User Conference San Jose, CA, Dec. 2001, 8 pgs.

Wu, P. et al. "ViperBGA: A Novel Design Approach to High Performance and High Density BGA's" Proceedings of the 21st IEEE/CPMT International Electronics Manufacturing Technology Symposium, Austin, TX, Oct. 13-15, 1997, pp. 386-390.

Ying, C. et al. "Automated Pin Grid Array Package Routing on Multilayer Ceramic Substrates" IEEE Transactions on Very Large Scale Integration(VLSI) Systems, Dec. 1993, vol. 1, No. 4, pp. 571-575.

Yu, M.-F. et al. "Single-Layer Fanout Routing and Routability Analysis for Ball Grip Arrays" 1995 IEEE/ACM International Conference on Computer-Aided Design (ICCAD '95), 1995, pp. 581-586.

Yu, M.-F. et al. "Interchangeable Pin Routing with Application to Package Layout" 1996 IEEE/ACM International Conference on Computer-Aided Design (ICCAD '96) 1996, pp. 668-673

* cited by examiner

METHOD AND SYSTEM FOR OPTIMIZED AUTOMATED IC PACKAGE PIN ROUTING

RELATED APPLICATIONS

This application claims the benefit under 35 U.S.C. § 119 (e) of U.S. Provisional Patent Application No. 60/629,804, entitled "Method and System for Optimized Automated IC Package Pin Routing," filed Nov. 20, 2004, the complete contents of which is incorporated herein by reference. The present application is also related to U.S. Pat. No. 6,516,447, entitled "Topological Global Routing for Automated IC Package Interconnect," issued Feb. 4, 2003, and U.S. patent application Ser. No. 10/357,642, entitled "Topological Global Routing for Automated IC Package Interconnect," filed Feb. 3, 2003, the complete contents of which are incorporated herein by reference.

FIELD OF THE INVENTION

The field of the invention relates generally to circuit package design, and more particularly to systems and methods for automating IC package pin routing design and layout.

BACKGROUND

As designers strive to improve the capabilities of new ICs, minimization of circuit size continues to be an underlying goal. Recent developments in IC design have dramatically increased the power, speed, and capability of the IC. As the power, speed, and capability of ICs increase, the number of input output terminals that each IC is interconnected with has also increased.

Normally, Integrated Circuits (ICs) are placed inside a "package" before they can be installed on a Printed Circuit Board (PCB). IC Package Interconnect is the process of designing the electrical tracks between the terminals on the IC die and the pads on the package. Using Electronic Design Automatic (EDA) tools, the human designer takes net data from the IC die and footprint data from the PCB package. The designer then uses this data to design the electrical tracks within the package to connect the IC die to the substrate. Once these connections are made a connection is made to the package pins.

Only a few years ago, most packages had only a few dozen or at most a few hundred pads. The routing required to connect to these pads was not particularly difficult or time consuming. Modem Ball Grid Array (BGA) packages now routinely have hundreds or thousands of pads. Some have over ten thousand pads. A task that previously took a few hours can now take days or even weeks. Each step of the process that can be automated saves significant amounts of effort, thus reducing both time-to-market and time-to-volume. Thus, an automated solution is needed.

One approach is to use design tools which require a designer to manually determine each interconnect wire in an IC package. As the complexity of IC packages has increased, such a solution has obvious shortcomings. Various routing packages have also been developed to accomplish this task. These routers use all-angle auto routing with packaging-specific algorithms. They use a direct line-of-sight approach to solving the problems specific to BGA and CSP rather than traditional horizontal/vertical routing. While these other approaches are suitable for simple designs, they have difficulty providing routing solutions for complex ICs.

Although automated assignment based on pin locations is fast, it is not accurate. Normally, manual editing will be required before the design is fully routable. Currently, there was no method (manual and automated) that always produces a routable design. Furthermore with currently available systems, until routing is performed (either manually or automatically), it is impossible to discover some assignment problems. Therefore, what is needed is a technique that uses dynamic routing information rather than static placement information such that the system always produces a routable solution, if one exists. The desired system could also optimize the layout to produce the shortest total track length.

Therefore, it is highly desirable to provide an automated system and method to provide an optimal routing solution for highly complex IC packages.

SUMMARY

One embodiment of the system can be utilized when two nets terminate on the same ring and the connection paths cross. The crossing of the connection paths could force the two nets to short together or could require excessive wandering to connect them. In one embodiment, the ring intersection can be identified and the nets can be reassigned to eliminate the crossing. The process can be iteratively repeated to uncross all such crossed paths.

A second embodiment of the system can be utilized to correct channel overload which occurs when the available space between two pads (or other landmarks) is not sufficient to contain the wires assigned between them. In an embodiment, IC net paths can be reassigned to other channels to avoid the channel overload.

Another embodiment of the system can be to utilized to solve conditions that visually appear to be crosses between nets that terminate on different rings. In an embodiment, the system can consider opportunities for swapping and/or jumping and then can perform swapping and/or jumping whenever doing so would reduce total etch length.

BRIEF DESCRIPTION OF THE DRAWINGS

The drawings illustrate the design and utility of preferred embodiments of the present invention. It should be noted that the figures are not drawn to scale and that elements of similar structures or functions are represented by like reference numerals throughout the figures. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
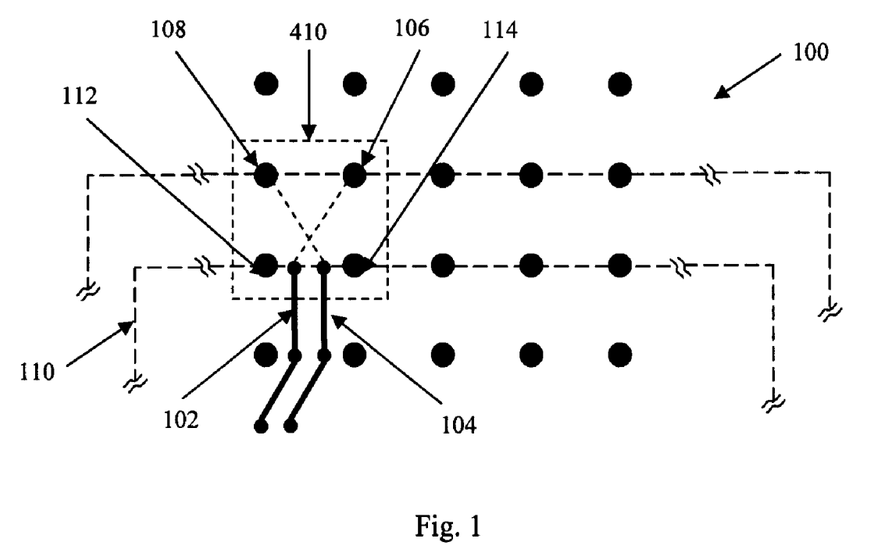
FIG. 1 depicts a BGA with crossed IC net assignments.

FIG. 1 depicts a BGA 100 which shows two IC nets 102, 104 which require assignment to pins or nodes on the BGA 100. As shown in FIG. 1, it is desired that the terminal end of the first IC net 102 should be connected to pin 106 on the BGA 100 and the terminal end of the second IC net 104 should be connected to a pin 108 on the BGA 100. Given the current proposed configuration of the IC nets 102, 104 relative to the pins 106, 108, the direct paths of connection between the terminal ends of the IC nets 102, 104 and their desired corresponding pins 106, 108 intersect. Such an intersection would result in a short within the circuit which could lead to undesired functionality of the circuit.

In one embodiment, such intersections can be located by analysis of the IC net data and the pin locations on the BGA 100. One attribute of a correctly formed IC Net-to-BGA pin routing solution is that connections should be routed on the same side (North, South, East, or West) of the BGA 100, and at most can only span two adjacent sides of the BGA 100. This attribute is utilized to identify that such a cross exists in the proposed design.

To determine if intersections exist, one option is to test all of the points contained on a given ring (adjacent sequence of pins) by traveling around the ring in a clockwise direction. For each pin 106, 108, 112, 114, for example a first pin 112, the system travels clockwise to its first neighboring pin 114, that has a connection to the next outer ring. If the system travels around two corners of the ring, then the system stops and traverses counterclockwise from the first pin 112, to find the next pin 112. From this pin 112, the system follows the pin's pointer to the next outer ring to the next pin 106. From this pin 106, the system travels in the opposite direction to its first neighboring pin 108 that has a connection to the next inner ring (the one containing pins 114 and 112). The system then follows this pin's 108 pointer to the next inner ring and expect to return back to our starting pin 112. If the traverse does not return to the first pin 112, then there is a crossed connection path that can be resolved.

Once a cross condition is detected, the first pin assignment causing the cross can be identified. Any additional nets that are also causing crosses will be resolved iteratively by additional passes of this process and system. Both the clockwise and counterclockwise directions can be searched to identify the net to pin assignment causing the intersection.

In an alternate embodiment, rather than traversing the entire ring in both directions, the process and system can sweep half the ring in each direction. This can be accomplished by counting nodes—which mark the corners of the ring—and stopping after the second pin is reached in each direction.

In still further alternate embodiments, connection intersections can be determined and identified in any convenient and/or known manner.

Figure 2:
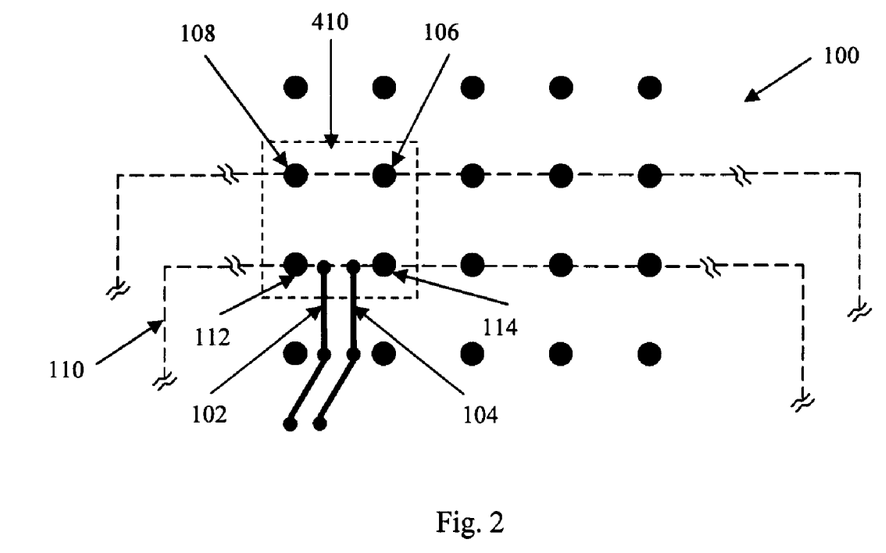
FIG. 2 depicts the BGA of FIG. 1 with the IC net assignments broken.

FIG. 2 depicts a BGA 100 similar to FIG. 1 with two IC nets 102, 104. However, the pins 106, 108 are no longer assigned to the IC nets 102, 104.

Figure 3:
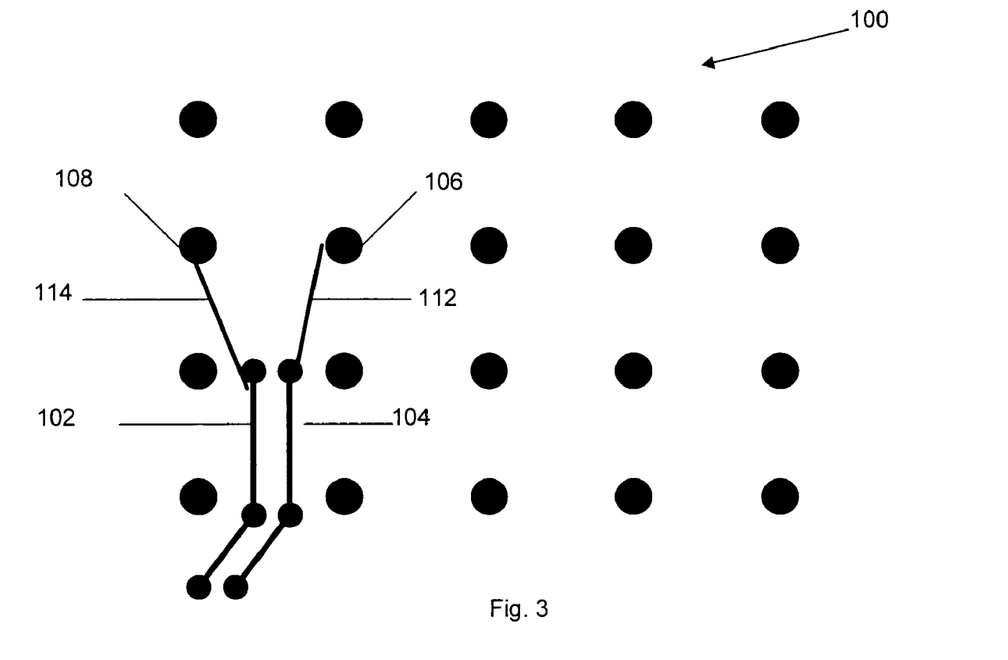
FIG. 3 depicts the BGA of FIG. 1 with the IC nets reassigned to eliminate the crossed condition.

FIG. 3 depicts a BGA 100 similar to FIG. 1 with two IC nets 102, 104. In the embodiment shown in FIG. 6, the pin assignments for the IC nets 102, 104 have been reversed, such that the IC nets 102, 104 are associated with pin 106, 108 such that intersecting paths are avoided and the etch length from termination of the IC nets to pins is reduced.

In the embodiment shown in FIGS. 1-3, Pin assignments to the IC nets are modified to eliminate connection intersections. However, in alternate embodiments, IC net assignments and/or pin assignments can be altered to eliminate connection intersections.

Figure 4:
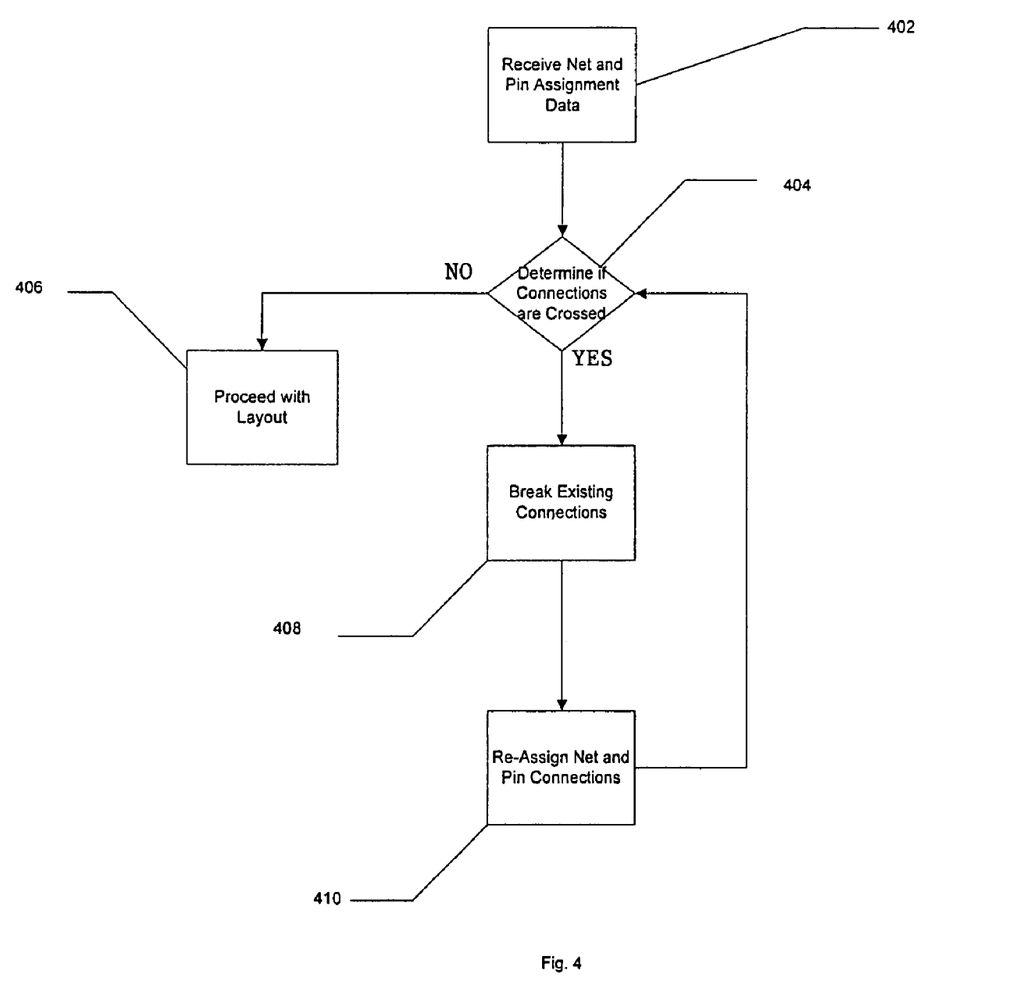
FIG. 4 depicts a flow chart of the steps of reassigning IC nets to eliminate a crossed condition.

FIG. 4 depicts a flow diagram of the process described in FIGS. 1-3. Step 402 describes receiving IC net and Pin data. Step 404 describes determining if an intersection results form the assignment of IC nets to specific pins.

In the embodiment shown in FIG. 4, if no intersections are located in the data, finalization of the design can be completed 406. However, if an intersection is located, existing crossed connections are broken in step 408. Reassignment of the broken connections is then performed in step 410. After reassignment of the IC Net/Pin connections is performed, the process and system returns to step 404 to determine if any intersections still exist.

Figure 5:
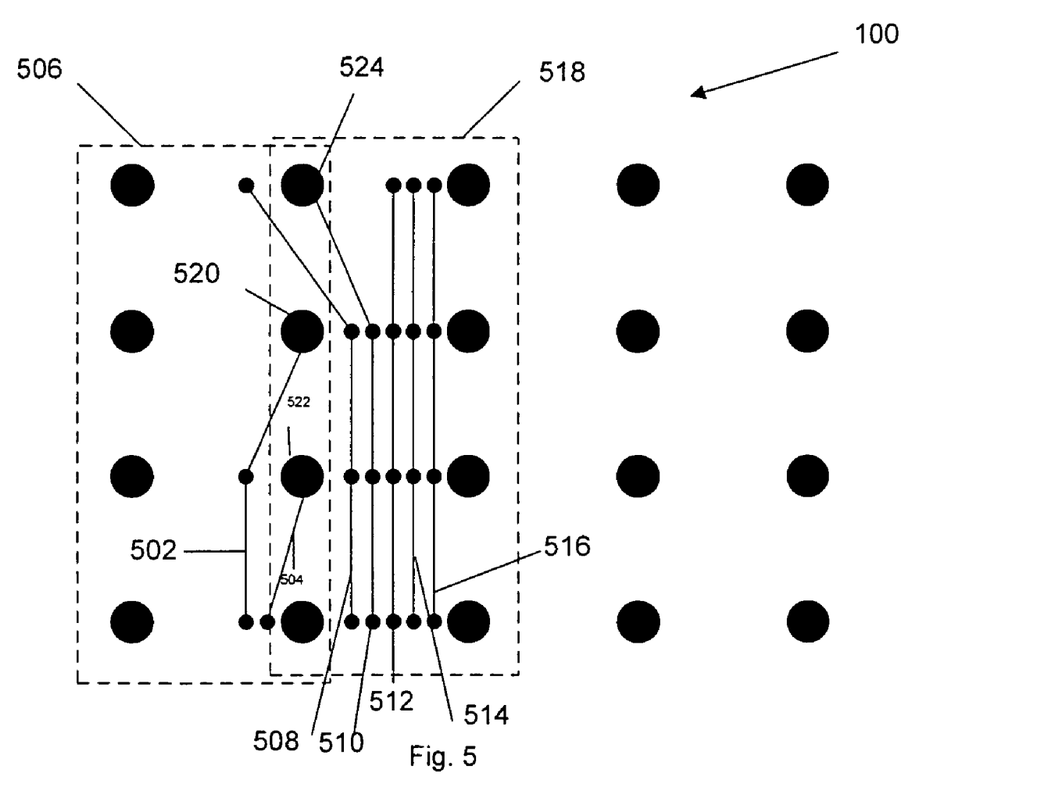
FIG. 5 depicts a BGA with an overloaded channel.

FIG. 5 depicts a BGA 100 which shows two IC nets 502, 504 within a first channel 506 and five IC nets 508, 510, 512, 514, 516 within a second channel 518. Based on spacing limitation rules, the second IC channel 518 is overloaded. FIG. 5 also shows that IC net 502 is coupled with pin 520, IC net 504 is coupled with pin 522 and IC net 510 is coupled with pin 524.

In the embodiment shown in FIG. 5, a channel is defined as the space potentially available for routes between two unmovable landmarks, such as pins. The route capacity of a channel is the number of routes that could fit within a channel, taking into account the space between the two landmarks, the width of each route, and the specified clearance that needs to be maintained between routes to other routes and the landmarks. A channel is considered to be full if no additional routes could be added into the channel without causing an overload condition to occur.

Jumping is the name given to moving a terminal end of a IC net or route of an IC net from one side of a landmark to another side.

In the embodiment shown in FIG. 5, available, unused space is calculated for each channel by finding the difference of the clearance between the two landmarks and the space currently consumed by the routes and clearances. A negative result indicates that an overflow condition exists.

In the embodiment shown in FIG. 5, an overloaded channel is detected by examining the BGA 100 in both clockwise and counterclockwise directions to find a first channel with available capacity. Once an available channel is identified, a combination of jumping and swapping (described above with regard to FIGS. 1-4) to move routing from an adjacent channel to the one with available capacity. Routes can continue to be shifted from channel to channel, while preserving valid connectivity, until the originally detected overload condition is cleared and no overloads remain in the processed channels.

Figure 6:
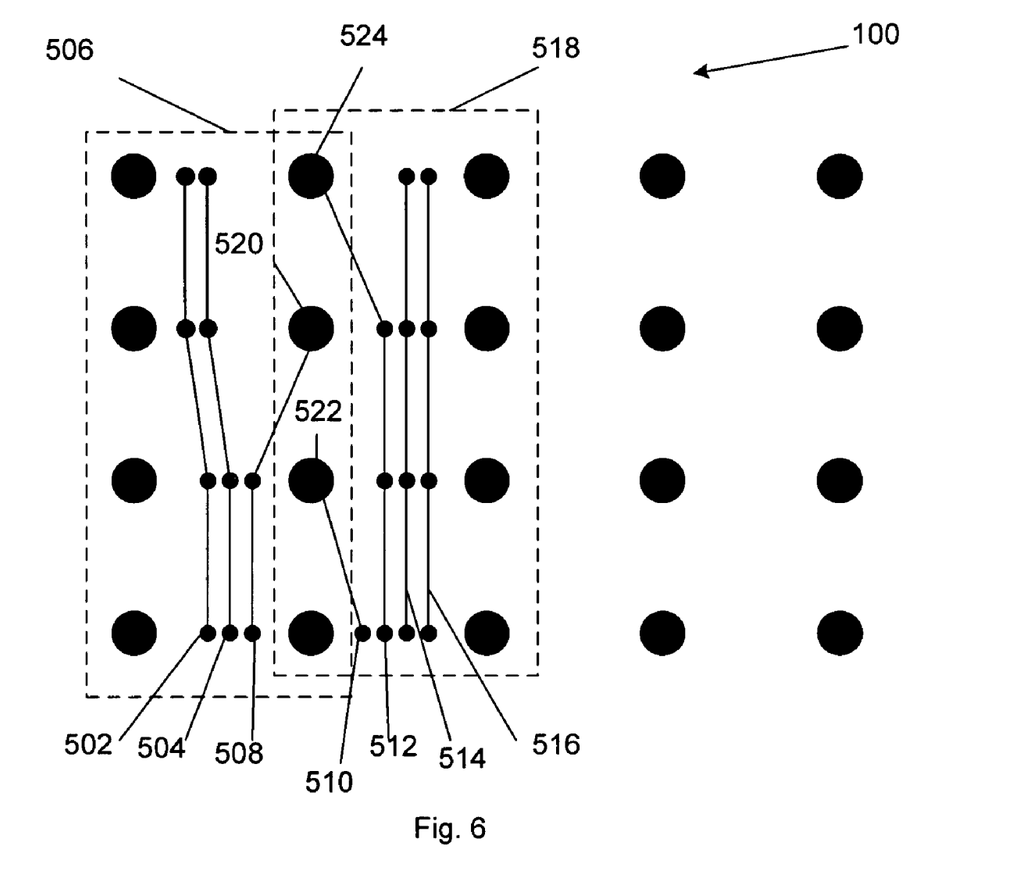
FIG. 6 depicts the BGA for FIG. 5 with IC nets reassigned to eliminate the overloaded channel.

FIG. 6 depicts a reconfiguration of overloaded BGA 100 channel shown in FIG. 5. Specifically, the embodiment shown in FIG. 6 depicts IC nets 502, 504, 508 a being located in one channel 506 and IC nets 510, 512, 514, 516 as being located in the second channel 518. In the reconfiguration shown in FIG. 6, IC Net 508 is coupled with pin 520 of the BGA 100, IC Net 510 is coupled with pin 522 of the BGA 100 and IC net 512 is couple with pin 524 of the BGA 100. Thus, the swapping process and system described in FIGS. 1-4 herein has been used in addition to jumping to resolve the overload.

To determine channels to which IC nets in an overloaded channel may be assigned, channels can be examined in a counterclockwise sequence from the overloaded channel to find the first channel with available capacity. However, in alternate embodiments, a clockwise or any other known and/or convenient search pattern may be used.

When an available channel is located IC nets are moved from the adjacent overloaded channel to the candidate channel by jumping, jumping with swapping (described in FIGS. 1-4), and/or swapping methods.

The process of search and move can then be repeated for each channel until the candidate channel is full, such that the addition of any available net to that channel would create an overload condition.

Figure 7:
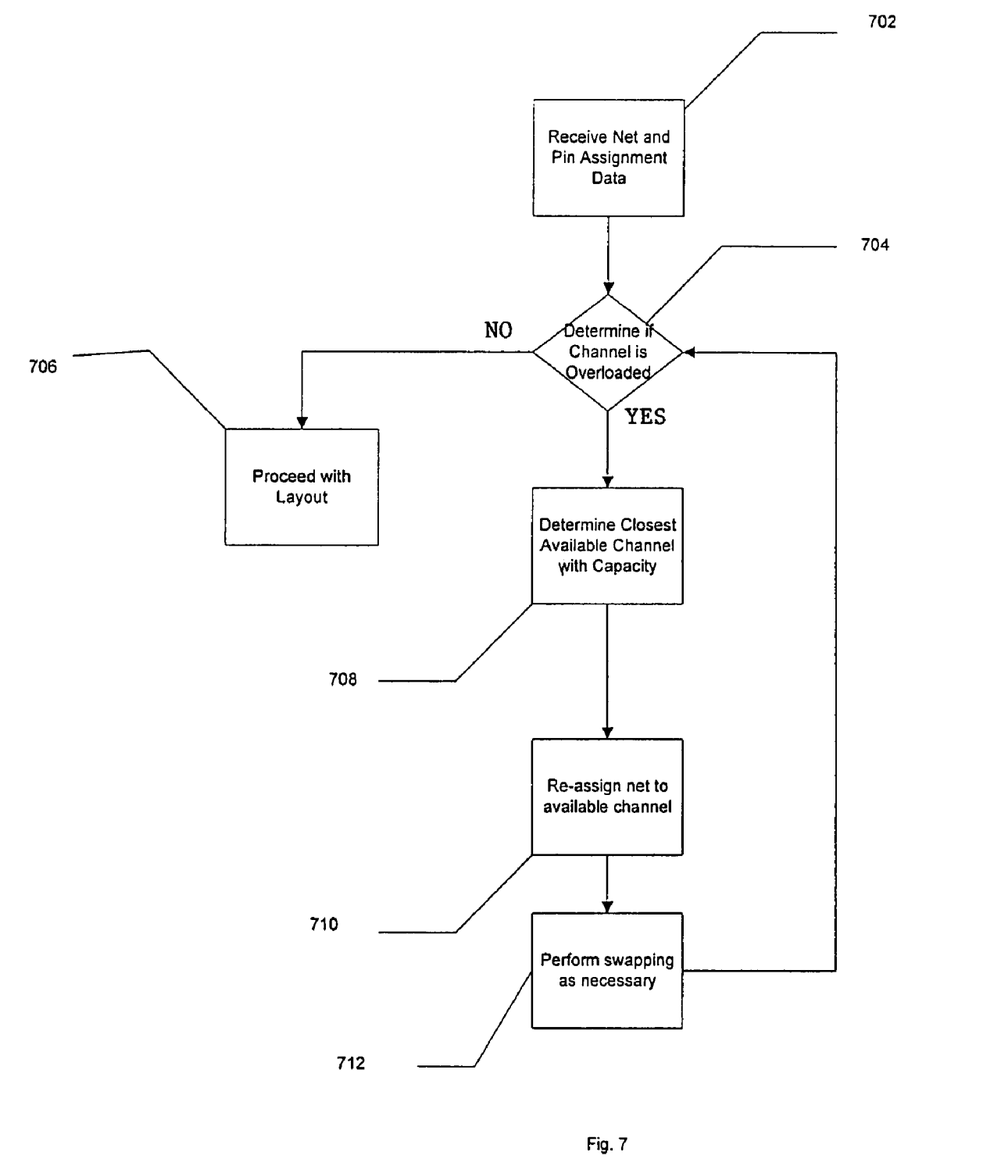
FIG. 7 depicts a flow chart of the steps for reassigning IC nets to eliminate an overloaded channel.

FIG. 7 depicts a flow chart describing the steps of determining if an overload condition exists and reassigning IC nets to eliminate the overloaded channel. In the embodiment shown in FIG. 7, IC net data and pin assignment data is received 702. The data is then examined by any known and/or convenient method to determine if an overloaded channel exists 704. If an overload condition is determined not to exist, the in step 706 layout of the product can proceed.

If an overload condition is determined to exist at step 704, then in step 708 the nearest channel with capacity is located. In step 710, IC nets are then reassigned to the available channels from the overloaded channel. Next, swapping (as described in FIGS. 1-4) is performed, if necessary, to eliminate crossed connection paths in step 712. The data can then be reexamined to determine if any overloaded channels remain 704 and the process can be repeated, until overloaded channels are removed.

Figure 8:
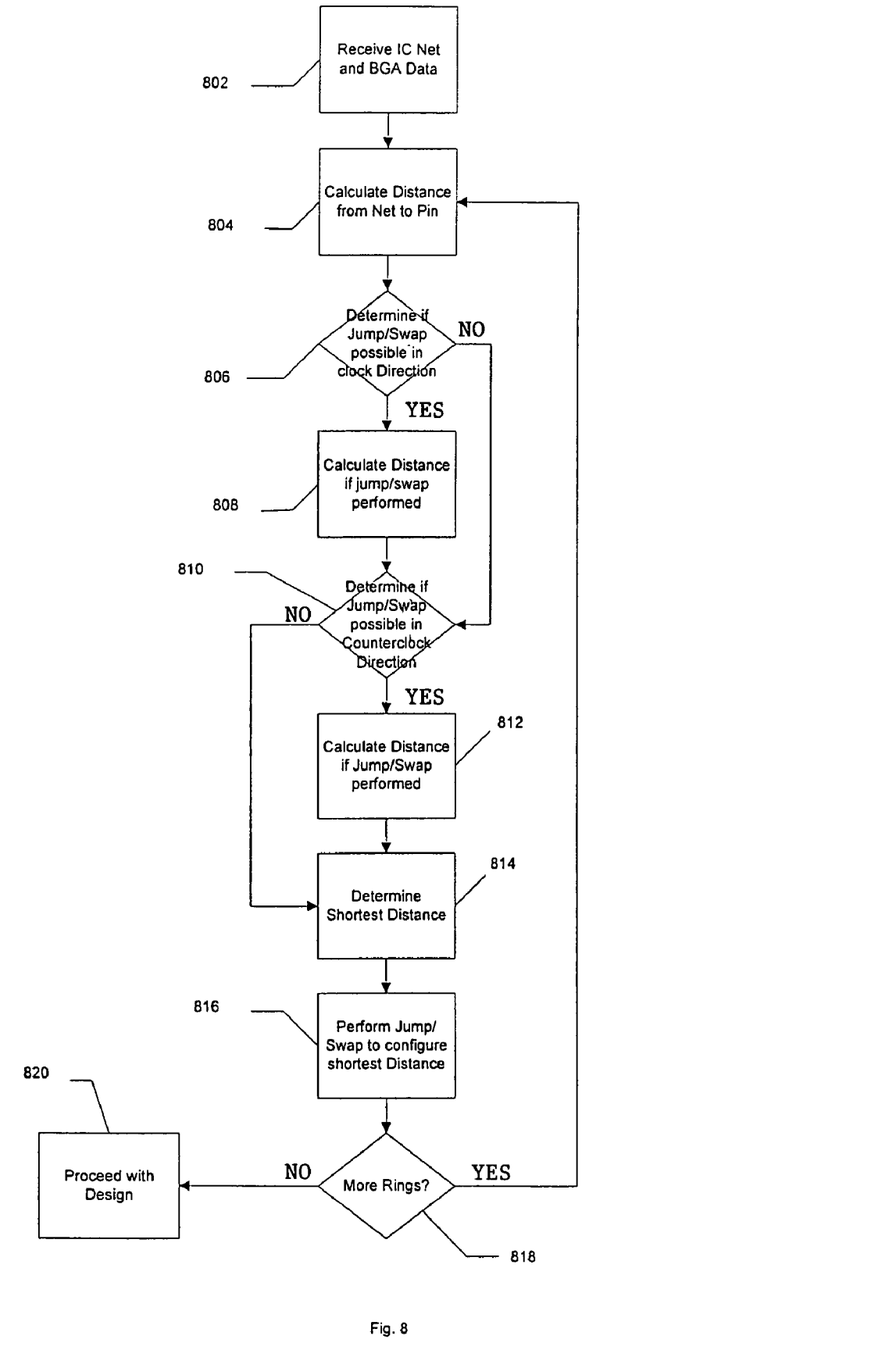
FIG. 8 depicts a flow chart of the steps of using swapping and jumping to reduce IC net to BGA connection paths.

In the embodiment shown in FIG. 8, each pair of adjacent nets can be examined on a ring by ring basis, to determine if exchanging a net's intersection with a ring will result in a shorter connection distance.

In the embodiment shown in FIG. 8, the exchange can be accomplished by any combination of jumping and/or swapping to yield valid connections after the exchange.

In step 802, IC net data and BGA data are received and in step 804, the distances from IC nets to pins is determined for an IC net to pin assignment is calculated. In the embodiment shown in FIG. 8 in step 806, a determination whether any combination of jumping and/or swapping with the clockwise adjacent ring would result in valid connectivity of the IC nets to pins. If any combination of jumping and/or swapping will yield valid connectivity, then the distances from IC nets to pins is determined for the proposed configuration 808. If a new configuration is not possible, then at step 810 a determination will be made whether any combination of jumping and/or swapping with the counterclockwise adjacent ring would result in valid connectivity of the IC nets to pins. If any combination of jumping and/or swapping will yield valid connectivity, then the distances from IC nets to pins is determined for the proposed configuration 812.

The shortest distance of the calculated distances is then determined 814 and the jumps and/or swaps associated with the shortest calculated distances is performed 816. Next it is determined if more rings need to be evaluated 818. If more rings remain to be evaluated, the process is repeated on the remaining nets. If there are no remaining rings, the design process can proceed 820

In one embodiment, each net on each routing ring can be examined, starting at the center of the design and moving outward. However, in alternate embodiments, the rings can be examined in any convenient and/or known manner.

The execution of the sequences of instructions required to practice the embodiments may be performed by a computer system 900 as shown in FIG. 4. In an embodiment, execution of the sequences of instructions is performed by a single computer system 900. According to other embodiments, two or more computer systems 900 coupled by a communication link 902 may perform the sequence of instructions in coordination with one another. Although a description of only one computer system 900 will be presented below, however, it should be understood that any number of computer systems 900 may be employed to practice the embodiments.

A computer system 900 according to an embodiment will now be described with reference to FIG. 4, which is a block diagram of the functional components of a computer system 900. As used herein, the term computer system 900 is broadly used to describe any computing device that can store and independently run one or more programs.

Figure 9:
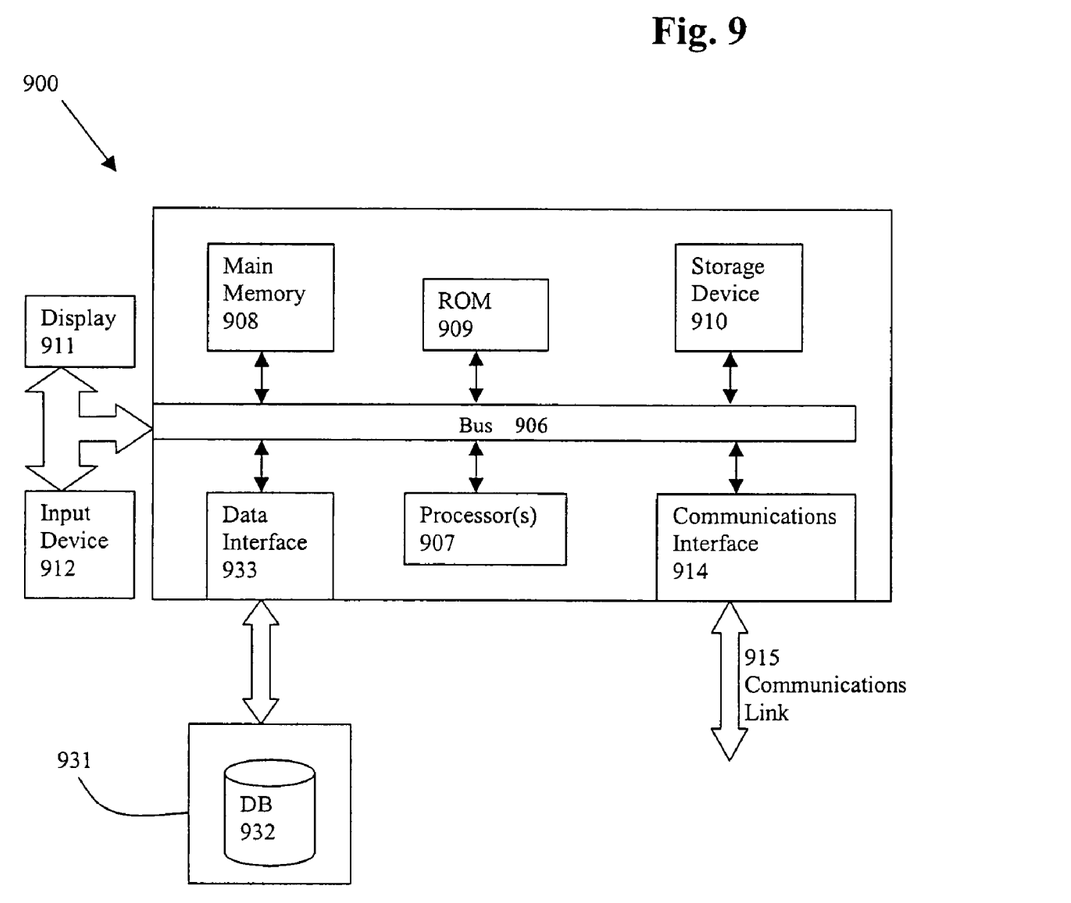
FIG. 9 depicts a computer system capable of implementing embodiments depicted in FIGS. 1-8.

Each computer system 900 may include a communication interface 906 coupled to the bus 904. The communication interface 906 provides two-way communication between computer systems 900. The communication interface 906 of a respective computer system 900 transmits and receives electrical, electromagnetic or optical signals, that include data streams representing various types of signal information, e.g., instructions, messages and data. A communication link 902 links one computer system 900 with another computer system 900. For example, the communication link 902 may be a LAN, in which case the communication interface 906 may be a LAN card, or the communication link 902 may be a PSTN, in which case the communication interface 906 may be an integrated services digital network (ISDN) card or a modem, or the communication link 902 may be the Internet, in which case the communication interface 906 may be a dial-up, cable or wireless modem.

A computer system 900 may transmit and receive messages, data, and instructions, including program, i.e., application, code, through its respective communication link 902 and communication interface 906. Received program code may be executed by the respective processor(s) 908 as it is received, and/or stored in the storage device 910, or other associated non-volatile media, for later execution.

In an embodiment, the computer system 900 operates in conjunction with a data storage system 912, e.g., a data storage system 912 that contains a database 914 that is readily accessible by the computer system 900. The computer system 900 communicates with the data storage system 912 through a data interface 916. A data interface 916, which is coupled to the bus 904, transmits and receives electrical, electromagnetic or optical signals, that include data streams representing various types of signal information, e.g., instructions, messages and data. In embodiments, the functions of the data interface 916 may be performed by the communication interface 906.

Computer system 900 includes a bus 904 or other communication mechanism for communicating instructions, messages and data, collectively, information, and one or more processors 908 coupled with the bus 904 for processing information. Computer system 900 also includes a main memory 918, such as a random access memory (RAM) or other dynamic storage device, coupled to the bus 904 for storing dynamic data and instructions to be executed by the processor(s) 908. The main memory 918 also may be used for storing temporary data, i.e., variables, or other intermediate information during execution of instructions by the processor(s) 908.

The computer system 900 may further include a read only memory (ROM) 920 or other static storage device coupled to the bus 904 for storing static data and instructions for the processor(s) 908. A storage device 910, such as a magnetic disk or optical disk, may also be provided and coupled to the bus 904 for storing data and instructions for the processor(s) 908.

A computer system 900 may be coupled via the bus 904 to a display device 922, such as, but not limited to, a cathode ray tube (CRT), for displaying information to a user. An input device 924, e.g., alphanumeric and other keys, is coupled to the bus 904 for communicating information and command selections to the processor(s) 908.

According to one embodiment, an individual computer system 900 performs specific operations by their respective processor(s) 908 executing one or more sequences of one or more instructions contained in the main memory 918. Such instructions may be read into the main memory 918 from another computer-usable medium, such as the ROM 920 or the storage device 910. Execution of the sequences of instructions contained in the main memory 918 causes the processor(s) 908 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 908. Such a medium may take many forms, including, but not limited to, non-volatile and volatile media. Non-volatile media, i.e., media that can retain information in the absence of power, includes the ROM 920, CD ROM, magnetic tape, and magnetic discs. Volatile media, i.e., media that can not retain information in the absence of power, includes the main memory 918. Transmission media includes coaxial cables, copper wire and fiber optics, including the wires that comprise the bus 904. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

What is claimed is:

1. A method for improving the routability of one or more nets of an electronic circuit design, comprising:
    receiving data of a ball grid array (BGA), including pin location information;
    receiving net data, including net position information;
    associating net position information with pin location information such that connection paths are identified;
    determining whether there exists an intersection among the connection paths by traversing one or more rings;
    determining whether reassignment of a net position relative to a pin location would result in at least one of:
        an elimination of the intersection among the connection paths,
        a shorter connection path, and
        an resolution of an overloaded channel by moving one or more of the connection paths to another channel with available capacity;
    creating or updating a routing solution for the electronic circuit design by modifying at least one of said net data and said data of the ball grid array based at least in part on the act of determining whether there exists an intersection, wherein the act of creating or updating the routing solution is performed by a computer processor; and
    storing the routing solution on a computer readable storage medium or a storage device or displaying the routing solution on a display apparatus.

2. The method of claim 1:
    wherein said pin location information includes at least a first pin location and a second pin location;
    wherein said net position location includes at least first net position and a second net position;
    wherein, prior to modifying at least one of said net data and said data of the ball grid array, said first pin location is associated with said first net position and said second pin location is associated with said second net position; and
    wherein, subsequent to modifying at least one of said net data and said data of the ball grid array, said first pin location is associated with said second net position.

3. The method of claim 2, wherein, subsequent to modifying at least one of said net data and said data of the ball grid array, said second pin location is associated with said first net position.

4. The method of claim 2, wherein said first pin location and said second pin location are adjacent.

5. The method of claim 1, further comprising:
    identifying a first overloaded channel, prior to modifying at least one of said net data and said BGA data; and
    identifying at least one channel adjacent to said first overloaded channel.

6. The method of claim 5 wherein modifying at least one of said net data and said data of the ball grid array comprises:
    re-associating said net position information and said pin location information such that said first overloaded channel includes at least one less connection path.

7. The method of claim 6, wherein re-associating said net position information and said pin location information results in re-routing of said at least one less connection path to a channel adjacent to said first overloaded channel.

8. The method of claim 1, wherein determining further comprises:
    determining a length of a first connection path from a first net to a first pin location;
    determining a length of a second connection path from a second net to a second pin location;
    calculating a sum of the lengths of said first connection path and said second connection path;
    determining a length of a first alternate connection path from said first net to said second pin location;
    determining a length of a second alternate connection path from said second net to said first pin location;
    calculating a sum of the lengths of said first alternate connection path and said second alternate connection path;
    re-associating said net position information and said pin location information such that said first net is associated with said second pin location and said second net is associated with said first pin location, if the sum of the lengths of said first alternate connection path and said second alternate connection path exceeds the sum of the lengths of said first connection path and said second connection path.

9. The method of claim 8 wherein said first net and said second net are adjacent.

10. The method of claim 1, further comprising:
determining whether any portion of said net data is unable to be modified; and
determining whether any portion of said data of the ball grid array is unable to be modified.

11. The method of claim 10 wherein modifying is based, at least in part, on at least one of, said determination whether any portion of said net data is unable to be modified and said determination whether any portion of said data of the ball grid array is unable to be modified.

12. The method of claim 1, in which the act of determining whether there exists an intersection by traversing one or more rings comprises:
identifying a first path of traversal by traversing, from a first pin, at least a portion of a first ring in a first direction;
determining whether a first criterion is satisfied;
identifying a second path of traversal by traversing a second ring from a second pin; and
determining whether the intersection exists based at least in part upon the first path of traversal and the second path of traversal.

13. The method of claim 12, further comprising: identifying the second pin along the at least a portion of the first ring, wherein the second pin leads to a second ring.

14. The method of claim 12, in which the first criterion comprises determining whether the act of traversing, from a first pin, at least a portion of a first ring has traversed a plurality of corner nodes of the first ring.

15. The method of claim 12, in which the first criterion comprises determining whether the act of traversing, from a first pin, at least a portion of a first ring has traversed a plurality of sides of the first ring.

16. The method of claim 12, in which the first criterion is not satisfied, further comprising:
identifying the first path of traversal by traversing, from a first pin, at least a second portion of the first ring in a direction opposite to the first direction.

17. The method of claim 12, in which the act of traversing a second ring from the second pin is performed in the first direction.

18. The method of claim 12, in which the act of traversing a second ring from the second pin is performed in a reverse direction of the first direction.

19. The method of claim 1, in which the first ring is connect to a first net, and the second pin is connect to the first net or a second net.

20. The method of claim 1, in which the act of modifying at least one of said net data and said data of the ball grid array to produce a fully routable version of the electronic circuit design comprises:
reassigning a first pin to a second net; and
reassigning a second pin to a first net, wherein
the first pin was assigned to the first net,
the second pin was assigned to the second net, and
there exists the intersection between the connection paths of the first pin to the first net and the second pin to the second net.

21. A computer storage device comprising a sequence of instructions which, when executed on a processor, causes the processor to execute a method for improving the routability of one or more nets of an electronic circuit design, the method comprising:
receiving data of a ball grid array (BGA), including pin location information;
receiving net data, including net position information;
associating net position information with pin location information such that connection paths are identified;
determining whether there exists an intersection among the connection paths by traversing one or more rings;
determining whether reassignment of a net position relative to a pin location would result in at least one of:
an elimination of the intersection among the connection paths,
a shorter connection path, and
a resolution of an overloaded channel by moving one or more of the connection paths to another channel with available capacity; and
creating or updating a routing solution for the electronic circuit design by modifying at least one of said net data and said data of the ball grid array based at least in part on the act of determining whether there exists an intersection.

22. The computer storage device of claim 21:
wherein said pin location information includes at least a first pin location and a second pin location;
wherein said net position location includes at least first net position and a second net position;
wherein, prior to modifying at least one of said net data and said BGA data, said first pin location is associated with said first net position and said second pin location is associated with said second net position; and
wherein, subsequent to modifying at least one of said net data and said BGA data, said first pin location is associated with said second net position.

23. The computer storage device of claim 22, wherein, subsequent to modifying at least one of said net data and said BGA data, said second pin location is associated with said first net position.

24. The computer storage device of claim 22, wherein said first pin location and said second pin location are adjacent.

25. The computer storage device of claim 21, further comprising:
identifying a first overloaded channel, prior to modifying at least one of said net data and said data of the ball grid array;
identifying at least one channel adjacent to said first overloaded channel.

26. The computer storage device of claim 25 wherein modifying at least one of said net data and said data of the ball arid array comprises:
re-associating said net position information and said pin location information such that said first overloaded channel includes at least one less connection path.

27. The computer storage device of claim 26, wherein re-associating said net position information and said pin location information results in re-routing of said at least one less connection path to a channel adjacent to said first overloaded channel.

28. The computer storage device of claim 21, wherein the act of determining whether reassignment of a net position relative to a pin location further comprises:
determining a length of a first connection path from a first net to a first pin location;
determining a length of a second connection path from a second net to a second pin location;
calculating a sum of the lengths of said first connection path and said second connection path;
determining a length of a first alternate connection path from said first net to said second pin location;
determining a length of a second alternate connection path from said second net to said first pin location;
calculating a sum of the lengths of said first alternate connection path and said second alternate connection path;

re-associating said net position information and said pin location information such that said first net is associated with said second pin location and said second net is associated with said first pin location, if the sum of the lengths of said first alternate connection path and said second alternate connection path exceeds the sum of the lengths of said first connection path and said second connection path.

29. The computer storage device of claim 28 wherein said first net and said second net are adjacent.

30. The computer storage device of claim 21, further comprising:
determining whether any portion of said net data is unable to be modified; and
determining whether any portion of said data of the ball grid array is unable to be modified.

31. The computer storage device of claim 30 wherein modifying is based, at least in part, on at least one of, said determination whether any portion of said net data is unable to be modified and said determination whether any portion of said data of the ball grid array is unable to be modified.

32. A computerized system for improving the routability of one or more nets of an electronic circuit design, comprising:
receiving data of a ball arid array (BGA), including pin location information;
receiving net data, including net position information;
associating net position information with pin location information such that connection paths are identified;
determining whether there exists an intersection among the connection paths by traversing one or more rings;
determining whether reassignment of a net position relative to a pin location would result in at least one of:
an elimination of the intersection among the connection paths,
a shorter connection path, and
an resolution of an overloaded channel by moving one or more of the connection paths to another channel with available capacity;
creating or updating a routing solution for the electronic circuit design by modifying at least one of said net data and said data of the ball arid array based at least in part on the act of determining whether there exists an intersection; and a computer readable storage medium for storing the routing solution or a display apparatus configured for displaying the routing solution.

33. The system of claim 32:
wherein said pin location information includes at least a first pin location and a second pin location;
wherein said net position location includes at least first net position and a second net position;
wherein, prior to modifying at least one of said net data and said data of the ball grid array, said first pin location is associated with said first net position and said second pin location is associated with said second net position; and
wherein, subsequent to modifying at least one of said net data and said data of the ball grid array, said first pin location is associated with said second net position.

34. The system of claim 33, wherein, subsequent to modifying at least one of said net data and said data of the ball grid array, said second pin location is associated with said first net position.

35. The system of claim 33, wherein said first pin location and said second pin location are adjacent.

36. The system of claim 32, further comprising:
identifying a first overloaded channel, prior to modifying at least one of said net data and said data of the ball grid array;
identifying at least one channel adjacent to said first overloaded channel.

37. The system of claim 36 wherein modifying at least one of said net data and said BGA data comprises:
re-associating said net position information and said pin location information such that said first overloaded channel includes at least one less connection path.

38. The system of claim 37, wherein re-associating said net position information and said pin location information results in re-routing of said at least one less connection path to a channel adjacent to said first overloaded channel.

39. The system of claim 32, wherein determining further comprises:
determining a length of a first connection path from a first net to a first pin location;
determining a length of a second connection path from a second net to a second pin location;
calculating a sum of the lengths of said first connection path and said second connection path;
determining a length of a first alternate connection path from said first net to said second pin location;
determining a length of a second alternate connection path from said second net to said first pin location;
calculating a sum of the lengths of said first alternate connection path and said second alternate connection path;
re-associating said net position information and said pin location information such that said first net is associated with said second pin location and said second net is associated with said first pin location, if the sum of the lengths of said first alternate connection path and said second alternate connection path exceeds the sum of the lengths of said first connection path and said second connection path.

40. The system of claim 39 wherein said first net and said second net are adjacent.

41. The system of claim 32, further comprising:
determining whether any portion of said net data is unable to be modified; and
determining whether any portion of said data of the ball grid array is unable to be modified.

42. The system of claim 41 wherein modifying is based, at least in part, on at least one of, said determination whether any portion of said net data is unable to be modified and said determination whether any portion of said data of the ball grid array is unable to be modified.

43. A method for improving the routability of one or more nets of an electronic circuit design, comprising:
receiving data of the ball grid array (BGA);
receiving net data;
associating said data of the ball grid array with said net data;
determining whether there exists an intersection among the connection paths by traversing one or more rings;
determining whether re-association of said data of a ball grid array and said net data would result in improved IC package pin routing, wherein determining includes determining whether an alternate connection path would result in at least one of an elimination of an intersection of connection paths, a shorter connection path distance, and an elimination of an overloaded channel;
creating or updating a routing solution for the electronic circuit design by modifying at least one of said data of a ball grid array and said net data based, at least in part, on the act of determining whether there exists an intersection, wherein the act of creating or updating the routing solution is performed by a computer processor; and storing the routing solution on a computer readable storage medium or a storage device or displaying the routing solution on a display apparatus.

44. The method of claim 43
wherein receiving data of a ball grid array includes receiving pin location data; and
wherein receiving net data includes receiving net position data.

45. The method of claim 44 wherein associating said data of a ball grid array with net data includes associating net position data and pin location data such that connection paths are determined between each net position datum and each pin location datum.

46. A system for optimized and automated IC package pin routing in electronic circuit design, comprising:
means for receiving data of a ball grid array (BGA);
means for receiving net data;
means for associating said data of a ball grid array with said net data;
means for determining whether there exists an intersection among the connection paths by traversing one or more rings;
means for determining whether re-association of said data of a ball grid array and said net data would result in improved IC package pin routing; and
means for creating or updating for the electronic circuit design a routing solution by modifying at least one of said data of a ball grid array and said net data based, at least in part, on a result of the means for determining whether there exists an intersection.

* * * * *